(12) United States Patent
Kim

(10) Patent No.: US 9,085,825 B2
(45) Date of Patent: Jul. 21, 2015

(54) DEPOSITION APPARATUS AND METHOD OF DEPOSITING THIN FILM USING THE SAME

(71) Applicant: ASM IP Holding B.V., Almere (NL)

(72) Inventor: Ki Jong Kim, Daejeon-si (KR)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 14/020,988

(22) Filed: Sep. 9, 2013

(65) Prior Publication Data

US 2014/0072726 A1    Mar. 13, 2014

(30) Foreign Application Priority Data

Sep. 11, 2012 (KR) .................. 10-2012-0100440

(51) Int. Cl.
*H05H 1/24* (2006.01)
*C23C 16/50* (2006.01)

(52) U.S. Cl.
CPC ...................... *C23C 16/50* (2013.01)

(58) Field of Classification Search
CPC ............ C23C 16/45557; C23C 16/50–16/505; H01J 37/32816–37/32834; H01J 37/32899
USPC ................... 427/569; 118/715, 719
See application file for complete search history.

(56) References Cited

U.S. PATENT DOCUMENTS

| | | | |
|---|---|---|---|
| 4,798,739 A * | 1/1989 | Schmitt | 427/569 |
| 5,112,641 A | 5/1992 | Harada | |
| 2005/0034664 A1 | 2/2005 | Koh | |
| 2010/0255196 A1* | 10/2010 | Geisler et al. | 427/248.1 |

FOREIGN PATENT DOCUMENTS

| | | |
|---|---|---|
| KR | 10-2001-0007431 | 1/2001 |
| KR | 10-2003-0038168 | 5/2003 |
| KR | 10-2008-0025567 | 3/2008 |

* cited by examiner

*Primary Examiner* — Elizabeth Burkhart
(74) *Attorney, Agent, or Firm* — Lexyoume IP Meister, PLLC

(57) ABSTRACT

A deposition apparatus and a method of depositing a thin film using the same are provided. By maintaining pressure of an external chamber between a reaction space and an outer wall slightly lower than pressure of the reaction space by supplying a charge gas to an external chamber of a space between the reaction space and an outer wall, parasitic plasma can be prevented from being generated within the external chamber. When loading or unloading a substrate, a charge gas of the external chamber can be prevented from flowing backward to the reaction space, and by supplying nitrogen gas as a charge gas, even if high plasma power is supplied, parasitic plasma can be effectively prevented from being generated in the external chamber.

7 Claims, 4 Drawing Sheets

DEPOSITION APPARATUS AND METHOD OF DEPOSITING THIN FILM USING THE SAME

CROSS-REFERENCE TO RELATED APPLICATION

This application claims priority to and the benefit of Korean Patent Application No. 10-2012-0100440 filed in the Korean Intellectual Property Office on Sep. 11, 2012, the entire contents of which are incorporated herein by reference.

BACKGROUND OF THE INVENTION (a) Field of the Invention

The present invention relates to a deposition apparatus and a method of depositing a thin film using the same.

(b) Description of the Related Art

In deposition apparatuses, in particular a deposition apparatus that can perform a plasma process, when plasma power is supplied to a reaction space, plasma is formed within the reaction space. However, in the conventional dual reactor structure, as shown in FIG. 1, when plasma is formed within a reaction space while high radio frequency (RF) power is supplied to an internal reactor, parasitic plasma may be formed in an external chamber enclosing the internal reactor. A potential of a reactor wall 101 should structurally become "0", but a potential difference occurs between the reactor wall and the ground, and thus, parasitic plasma is generated within the external chamber. In this way, when the plasma is generated in the external chamber as well as the reaction space within the reactor, while a plasma density within the reactor changes, the plasma has an influence on a process within the reactor.

The above information disclosed in this Background section is only for enhancement of understanding of the background of the invention, and therefore, it may contain information that does not form the prior art that is already known in this country to a person of ordinary skill in the art.

SUMMARY OF THE INVENTION

The present invention has been made in an effort to provide a deposition apparatus and a method of depositing a thin film using the same having advantages of performing a stable process by generating plasma only within a reactor, thus preventing parasitic plasma from being generated in an external chamber, even if high RF power is supplied to the reactor.

An exemplary embodiment of the present invention provides a deposition apparatus including: a substrate support that can support a substrate and that can move vertically; a reactor cover that forms a reaction chamber by contacting the substrate support; a charge gas inlet that is disposed at the reactor cover; a support pin that is inserted into the substrate support to support the substrate; a substrate support vertical driving means that drives the substrate support; and an external chamber including the reaction chamber, wherein a charge gas is supplied to the external chamber through the charge gas inlet.

Pressure that is maintained by the charge gas that is supplied to the external chamber may be lower than pressure within the reaction chamber. The charge gas may include an inert gas. in one aspect of the present invention, the charge gas may include nitrogen. A plurality of reaction chambers may exist.

Another exemplary embodiment of the present invention provides a depositing method including: supplying a raw material gas to a reaction chamber; generating plasma in the reaction chamber intermittently or continuously; and the above steps are repeated multiple times until a film with a desired thickness is formed. While the film deposition process is carried out into the reaction chamber, a charge gas is supplied to an external chamber that is located outside of the reaction chamber.

According to an exemplary embodiment of the present invention, by maintaining pressure of an external chamber at a level that is slightly lower than pressure of a reaction space during a process by supplying a charge gas to an external chamber space between the reaction space and an outer wall, parasitic plasma can be prevented from being generated within the external chamber. Further, when loading or unloading a substrate, a charge gas of the external chamber can be prevented from flowing backward to the reaction space, and by supplying nitrogen gas as a charge gas, even if high plasma power is supplied, parasitic plasma can be effectively prevented from being generated in the external chamber.

DETAILED DESCRIPTION OF THE EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Figure 1:
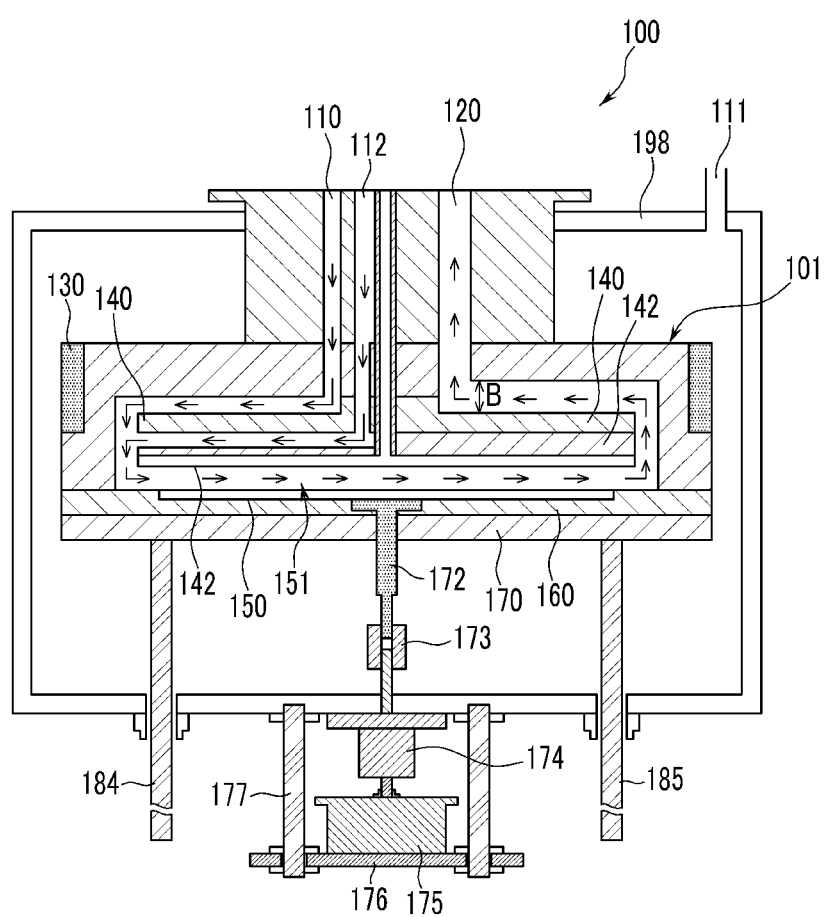
FIGS. 1 and 2 are cross-sectional views illustrating a deposition apparatus according to an exemplary embodiment of the present invention.
Figure 2:
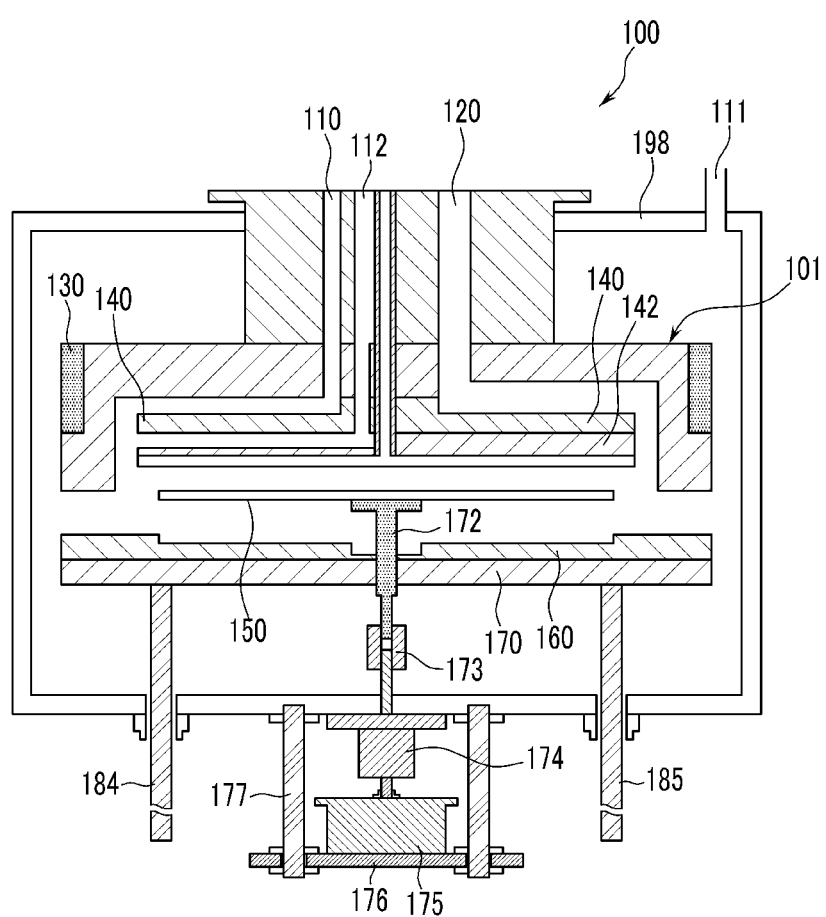

Hereinafter, a deposition apparatus and a deposition method using the same according to various exemplary embodiments of the present invention will be described with reference to FIGS. 1 and 2. FIGS. 1 and 2 are cross-sectional views illustrating a deposition apparatus according to an exemplary embodiment of the present invention. Specifically, FIG. 1 illustrates a cross-sectional view of a deposition apparatus when depositing a thin film and FIG. 2 illustrates a cross-sectional view of a deposition apparatus between thin film deposition processes.

Referring to FIGS. 1 and 2, a deposition apparatus 100 according to an exemplary embodiment of the present invention includes an outer wall 198, a substrate support 160 that supports a substrate, a reactor cover 101 that is formed on the substrate support 160 and that defines a reaction chamber by contacting the substrate support 160, gas inlets 110 and 112 that are connected to the reactor cover 101 and that inject a process gas into the reaction chamber and an outlet 120 that discharges the process gas from the reaction chamber, a charge gas inlet 111 that supplies a charge gas to an external chamber between the outer wall 198 and the outside of the reaction chamber, a substrate support heating device 170 that heats the substrate support 160, a substrate support driver that drives the substrate support 160, and a substrate rotation driver that rotates the substrate. The gas inlets 110 and 112 may be formed as one gas inlet.

In the reactor cover 101, a reactor cover heating device 130 may be provided. Inside the reactor cover 101, structures 140 and 142 induce a gas flow on the substrate, and enable a gas to flow in a horizontal direction to the substrate and maintain a gas flow within the reaction chamber similar to a laminar flow. However, in a deposition apparatus according to another exemplary embodiment of the present invention, a process gas may flow in a vertical direction to a substrate surface.

The substrate support driver may include three or more support shafts 184 and 185 that are connected to the substrate support 160 and a pneumatic pressure cylinder (not shown) for vertically driving the support shaft.

The substrate rotation driver includes a central support pin 172 that supports the substrate, a central support pin support 173 into which the central support pin 172 is inserted, and a central support pin rotation means that is connected to the central support pin support 173. The central support pin rotation means includes an electric motor 175 such as a step motor, a rotation feed-through 174 that is connected to an electric motor 175, a fixed plate 176 in which the electric motor 175 is mounted, and a fixed shaft 177 that is connected to the fixed plate 176. Further, the substrate rotation driver may further include a central support pin vertical driving means (not shown). The central support pin vertical driving means may use an electric motor or a pneumatic pressure cylinder.

A portion of a lower portion of the central support pin 172 that is inserted into the central support pin support 173 is removed by chamfering. However, because the lower portion of the center support pin 172 is not a complete cylindrical shape, a rotation motion of the central support pin rotation means is effectively transferred to the central support pin 172 through the central support pin support 173. The central support pin 172 may move in a vertical direction of the central support pin support 173.

The central support pin rotation means may include a device rotating by a predetermined angle using pneumatic pressure as well as an electrical means such as the electric motor 175.

A charge gas that is supplied through the charge gas inlet 111 that supplies a charge gas to the external chamber between the outer wall 198 and the outside of the reaction chamber is an inert gas. Preferably, the charge gas is nitrogen ($N_2$) gas. Further, the charge gas may be an inert gas having ionization energy that is substantially equal to or greater than that of the nitrogen gas.

By supplying the charge gas, pressure of the external chamber between the outer wall 198 and the outside of the reaction chamber may be slightly lower than pressure that is maintained at the reaction space for a deposition process. For example, pressure that is maintained at the reaction space for a deposition process may be about 1 Torr to about 10 Torr, and pressure of the external chamber may be lower than about 1 Torr to about 10 Torr.

Although not shown in the drawings, at the outer wall 198 of the reactor, a charge gas outlet for discharging the charge gas may be disposed.

Hereinafter, a horizontal flow deposition method according to an exemplary embodiment of the present invention will be described in detail with reference to FIGS. 1 and 2.

First, as shown in FIG. 1, as the substrate support 160 contacts the reactor cover 101 in a state in which a substrate 150 is mounted within the reaction chamber 151, by sequentially supplying raw material gases, a film is formed to a desired film thickness. In this case, a charge gas is supplied to the external chamber between the reaction chamber 151 and the outer wall 198 through the charge gas inlet 111. The charge gas is an inert gas and preferably includes nitrogen ($N_2$) gas. Further, the charge gas may be an inert gas having ionization energy that is substantially equal to or greater than that of the nitrogen gas.

Pressure of the external chamber between the reaction chamber 151 and the outer wall 198 that is maintained by supplying a charge gas may be lower by about 0.2 Torr to about 2 Torr than process pressure within the reaction chamber 151. By supplying an inert charge gas to the external chamber between the reaction chamber 151 and the outer wall 198 for a deposition process, parasitic plasma can be prevented from being generated within the external chamber. Further, by setting pressure of the external chamber to be slightly lower than pressure within the reaction chamber 151, a charge gas that is supplied to the external chamber can be prevented from being injected into the reaction chamber.

Further, by using the nitrogen ($N_2$) gas as a charge gas, parasitic plasma can be effectively prevented from being generated within the external chamber. Further, even when using an inert gas having ionization energy that is substantially equal to or greater than that of the nitrogen ($N_2$) gas as a charge gas, parasitic plasma can be effectively prevented from being generated within the external chamber as well.

Thereafter, as shown in FIG. 2, when stopping the supply of a raw material gas and using the substrate support driver, the substrate support 160 moves downward. In this case, the central support pin 172 does not move downward, and thus, the substrate 150 is separated from the substrate support 160. Then, the substrate 150 is taken out from the reactor by a robot arm (not shown) of the substrate transfer apparatus, and a new substrate is put on the reactor. In this way, even when the substrate 150 is taken out from the reactor, a charge gas may be supplied to the external chamber between the external chamber 151 and the outer wall 198 through the charge gas inlet 111. Even when the substrate 150 is transferred, by supplying a charge gas to the external chamber, a rapid pressure change between inner pressure and outer pressure of the reactor can be prevented.

Hereinafter, a deposition apparatus according to another exemplary embodiment of the present invention will be described with reference to FIG. 3.

Figure 3:
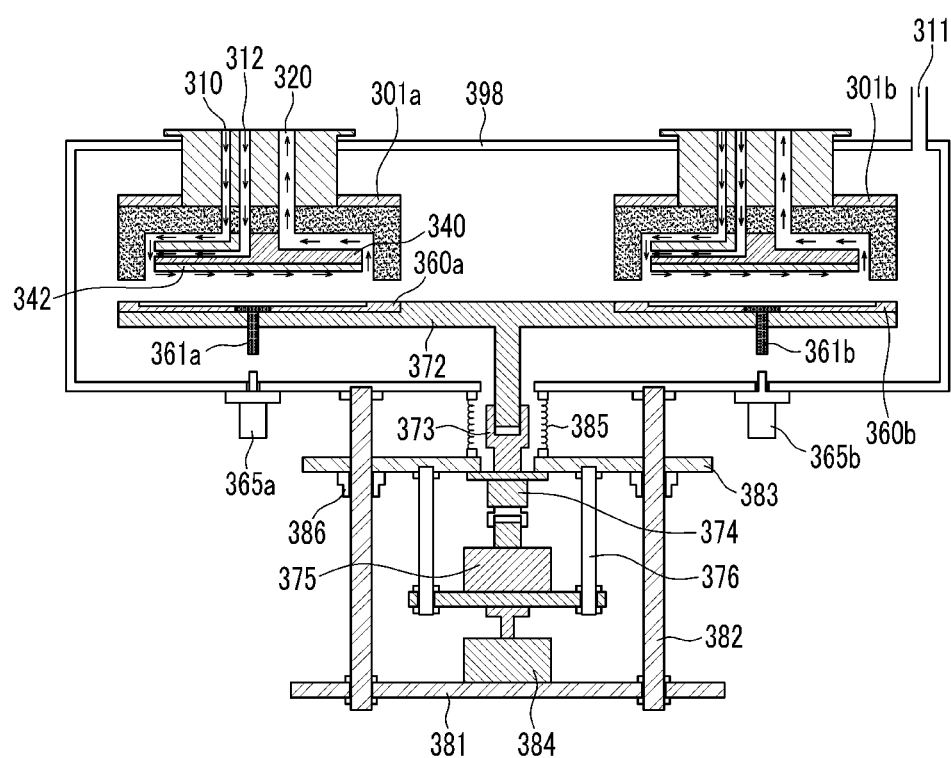
FIG. 3 is a cross-sectional view illustrating a deposition apparatus according to another exemplary embodiment of the present invention.

Referring to FIG. 3, a deposition apparatus according to an exemplary embodiment of the present invention is similar to the deposition apparatus that is shown in FIGS. 1 and 2. However, a plurality of reactors is provided within the chamber, unlike the deposition apparatus that is shown in FIGS. 1 and 2 where two reactors are shown in the drawing.

The reactor includes reactor covers 301a and 301b, substrate supports 360a and 360b, and substrate support pins 361a and 361b that are inserted into the substrate supports 360a and 360b, and the reactor covers 301a and 301b and the substrate supports 360a and 360b define a reaction chamber. In this case, because the substrate supports 360a and 360b can move vertically, after the substrate is disposed at a lower position, by moving the substrate supports 360a and 360b upward such that the substrate supports 360a and 360b are in close contact with the reactor covers 301a and 301b, the substrate supports 360a and 360b form a reactor that can perform a deposition process.

The reactor covers 301a and 301b of the reactor have inlets 310 and 312 and an outlet 320, respectively, which are inflow and discharge passages of a raw material gas. Alternatively, the gas inlets 310 and 312 may be formed as one gas inlet.

Inside each reactor cover 301a or 301b, the structures 340 and 342 induce a gas flow and enable a gas to flow in a horizontal direction on the substrate, and the structures 340 and 342 maintain a gas flow within the reaction chamber similar to laminar flow. However, in a deposition apparatus according to another exemplary embodiment of the present invention, an injected gas may flow in a vertical direction to a substrate surface.

Although not shown in the drawings, raw material gas supply pipes that are symmetrically branched from one raw material gas supply apparatus of a raw material gas corresponding to each reactor may be connected to a raw material gas inlet of each reactor. Further, an exhaust pipe that is connected to an outlet of each reactor symmetrically joins one exhaust pipe, and thus, may be connected to an exhaust pump.

A deposition apparatus according to the present exemplary embodiment has a charge gas inlet 311 that supplies a charge gas to the external chamber between an outer wall 398 and the outside of a plurality of reaction chambers.

Further, although not shown in the drawings, at the reactor outer wall 398, a charge gas outlet for discharging a charge gas may be disposed.

For a deposition process, while the substrate moves by loading or unloading from the reaction space, a charge gas is supplied to the external chamber between the reaction chamber and the outer wall through the charge gas inlet 311. The charge gas is an inert gas and preferably includes nitrogen ($N_2$) gas. Further, the charge gas may be an inert gas having ionization energy that is substantially equal to or greater than that of the nitrogen gas.

By supplying a charge gas, pressure of the external chamber between the reaction chamber and the outer wall may be maintained to be lower by about 0.2 Torr to about 2 Torr than process pressure within the reaction chamber. By supplying an inert charge gas to the external chamber between the reaction chamber and the outer wall 398 for a deposition process, parasitic plasma can be prevented from being generated within the external chamber. Further, by setting pressure of the external chamber to be slightly lower than pressure within the reaction chamber, a charge gas that is supplied to the external chamber can be prevented from being injected into the reaction chamber. Further, by using the nitrogen ($N_2$) gas as a charge gas, parasitic plasma can be effectively prevented from being generated within the external chamber. Further, even when using an inert gas having ionization energy that is substantially equal to or greater than that of the nitrogen gas as a charge gas, parasitic plasma can be effectively prevented from being generated within the external chamber.

Referring to FIG. 3, a deposition apparatus according to the present exemplary embodiment includes a bottom plate 372 that supports the substrate supports 360*a* and 360*b*, the support pins 361*a* and 362*b* that support the substrate when the substrate supports 360*a* and 360*b* move downward, and support pin supports 365*a* and 365*b* that support the support pins 361*a* and 361*b*.

Further, the deposition apparatus according to the present exemplary embodiment includes a substrate moving portion, substrates of each reactor are loaded in each reactor or are unloaded from each reactor through the substrate moving portion and may move between the reactors. The substrate moving portion includes a driving guide shaft 382 that is connected to an external cover of the deposition apparatus, a lower fixed plate 381 to which the driving guide shaft 382 is connected, a driving plate 383 that is connected to the driving guide shaft 382 through a bearing 386, a connection support 373 into which a protruded portion of the bottom plate 372 is inserted, a rotation feed-through 374, an electric motor 375, a vertical driving pneumatic pressure cylinder 384, and a vertical contractile bellows 385.

The bottom plate 372 that is connected to the substrate moving portion may be vertically driven by the substrate moving portion. Specifically, the vertical driving pneumatic pressure cylinder 384 of the substrate moving portion may vertically move the driving plate 383 in which the electric motor 375 and the rotation feed-through 374 are mounted, and such a vertical movement is transferred to the bottom plate 372 that supports the substrate supports 360*a* and 360*b* through the connection support 373 and a rotation shaft 376 of the electric motor 375, and thus, the substrate supports 360*a* and 360*b* are vertically moved. In this case, the vertical contractile bellows 385 performs a function of allowing an appropriate driving displacement when vertically moving.

FIG. 3 illustrates two reactors, but the number of a reactor of a deposition apparatus according to the present exemplary embodiment may be 2 to 8, preferably 2 to 4.

Hereinafter, a method of depositing a film according to an exemplary embodiment of the present invention, in particular, depositing a thin film using a horizontal flow deposition apparatus that is shown in FIG. 3 will be described.

First, all substrates are put on the substrate supports 360*a* and 360*b*, and in a state in which the reactor cover 301*a* is in close contact with the substrate support 360*a* and in which the reactor cover 301*b* is in close contact with the substrate support 360*b*, a film is deposited by sequentially supplying raw material gases until having a desired film thickness.

In this case, a charge gas is supplied to the external chamber between a plurality of reactors and the outer wall 398 through the charge gas inlet 311. The charge gas is an inert gas and preferably includes nitrogen ($N_2$) gas. Further, the charge gas may be an inert gas having ionization energy that is substantially equal to or greater than that of the nitrogen gas.

By supplying a charge gas, pressure of the external chamber between the reactor and the outer wall 398 may be maintained to be lower by about 0.2 Torr to about 2 Torr than process pressure within the reactor. By supplying an inert charge gas to the external chamber between the reactor and the outer wall 398 for a deposition process, parasitic plasma can be prevented from being generated within the external chamber. Further, by setting pressure of the external chamber to be slightly lower than pressure within the reactor, a charge gas that is supplied to the external chamber can be prevented from being injected into the reactor. Further, by using the nitrogen ($N_2$) gas as a charge gas, parasitic plasma can effectively be prevented from being generated within the external chamber. Further, even when using an inert gas having ionization energy that is substantially equal to or greater than that of the nitrogen gas as a charge gas, parasitic plasma can be effectively prevented from being generated within the external chamber.

Thereafter, after the supply of a raw material gas is stopped and the substrate support moves downward, a substrate in which a film of a desired thickness is formed is taken out.

In the present exemplary embodiment, a case in which two reactors are provided is described, but as described above, the number of reaction chambers may be 2 to 8.

Figure 4:
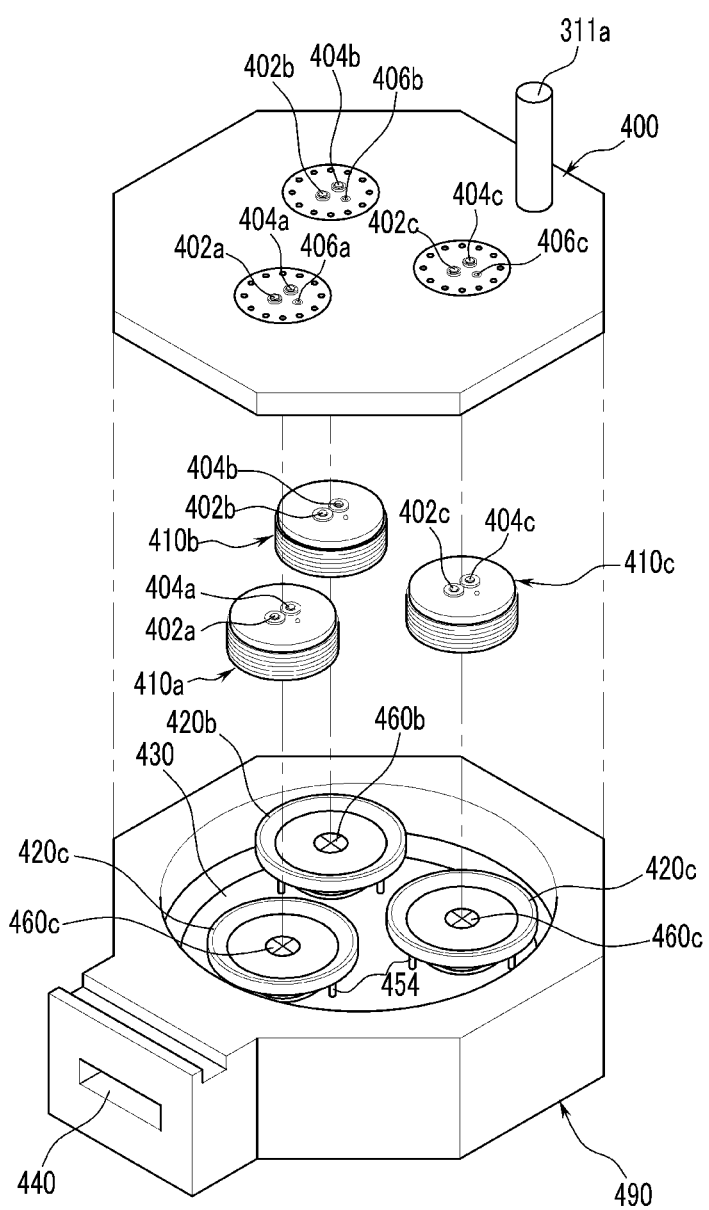
FIG. 4 is a perspective view illustrating a deposition apparatus according to another exemplary embodiment of the present invention.

Hereinafter, a deposition apparatus according to another exemplary embodiment of the present invention will be described with reference to FIG. 4. FIG. 4 is a perspective view illustrating a reactor of a horizontal flow deposition apparatus according to another exemplary embodiment of the present invention.

Referring to FIG. 4, three reactors are provided within a chamber for forming a film on a substrate. Each reactor includes reactor covers 410*a*, 410*b*, and 410*c*, substrate supports 420*a*, 420*b*, and 420*c*, and support pins 460*a*, 460*b*, and 460*c* that are inserted into the substrate supports 420*a*, 420*b*, and 420*c*, and the reactor covers 410*a*, 410*b*, and 410*c* and the substrate supports 420*a*, 420*b*, and 420*c* define a reaction chamber. The reactor covers 410a, 410b, and 410c include inlets 402a, 402b, and 402c and outlets 404a, 404b, and 404c, respectively, which are injection and discharge passages of a raw material gas and fixed to a chamber cover 400. At the chamber cover 400, a charge gas inlet 311a for supplying a charge gas to a space between a plurality of reactors and the chamber cover 400 and the chamber lower plate 490 is disposed.

For a deposition process, while the substrate moves by loading or unloading of the substrate, a charge gas is supplied to the external chamber between the reaction chamber and the outer wall through the charge gas inlet 311a. The charge gas is an inert gas and preferably includes nitrogen ($N_2$) gas. Further, the charge gas may be an inert gas having ionization energy that is substantially equal to or greater than that of nitrogen gas.

By supplying a charge gas, pressure of an external chamber between the reaction chamber and the outer wall may be maintained lower by about 0.2 Torr to about 2 Torr than process pressure within the reaction chamber. By supplying an inert charge gas to the external chamber between the reaction chamber and the chamber cover 400 and the chamber lower plate 490 for a deposition process, parasitic plasma can be prevented from being generated within the external chamber. Further, by setting pressure of the external chamber to be slightly lower than pressure within the reaction chamber, a charge gas that is supplied to the external chamber can be prevented from being injected into the reaction chamber. Further, by using the nitrogen ($N_2$) gas as a charge gas, parasitic plasma can be effectively prevented from being generated within the external chamber. Further, even when using an inert gas having ionization energy that is substantially equal to or greater than that of the nitrogen ($N_2$) gas as a charge gas, parasitic plasma can be effectively prevented from being generated within the external chamber.

In FIG. 4, an inlet and an outlet of a raw material gas are provided in the reactor cover, and the inlets 402a, 402b, and 402c and the outlets 404a, 404b, and 404c of a raw material gas are each connected to a separate raw material supply apparatus and exhaust apparatus through the chamber cover 400, but one raw material supply apparatus may be provided in the chamber cover 400, and in the raw material supply apparatus, a raw material supply pipe that is symmetrically branched to each of the reactors may be connected to a raw material inlet of each of the reactor covers 410a, 410b, and 410c. Further, an exhaust pipe that is connected to an outlet of each reactor symmetrically joins one exhaust pipe, and thus, may be connected to an exhaust pump. In the substrate supports 420a, 420b, and 420c in which the substrate is placed, a heating device (not shown) that can heat the substrate is housed.

Because the substrate supports 420a, 420b, and 420c may move vertically, after the substrate is disposed at a lower position, by moving the substrate supports 420a, 420b, and 420c upward, the substrate supports 420a, 420b, and 420c that is in close contact with the reactor covers 410a, 410b, and 410c form a reactor in which a deposition is carried out.

When the substrate supports 420a, 420b, and 420c move downward, the substrate supports 420a, 420b, and 420c include support pins 460a, 460b, and 460c that can support the support. In FIG. 4, one circular support pin is installed at the center, but the support pin may have different shapes. For example, at a position that is separated from the center, three support pins that perform a point contact with the substrate may be used.

At one side surface of a chamber wall that forms an outer wall of the chamber cover 400, a substrate inlet and outlet 440 that provides an inflow and outflow passage of the substrate is provided. The substrate may be loaded in each reactor or may be unloaded from each reactor through the substrate inlet and outlet 440.

In FIG. 4, three reactors are provided, but the number of the reactors may be 2 to 8.

Hereinafter, a deposition method according to an exemplary embodiment of the present invention that deposits a thin film using a deposition apparatus that is shown in FIG. 4 will be described.

First, in a state in which all substrates are put on three substrate supports and in which the reactor covers 410a, 410b, and 410c are in close contact with the substrate supports 420a, 420b, and 420c, a film is deposited by sequentially supplying raw material gases until having a desired film thickness.

In this case, a charge gas is supplied to an external chamber between a plurality of reactors and the chamber cover 400 and the chamber lower plate 490 through the charge gas inlet 311a. The charge gas is an inert gas and preferably includes nitrogen ($N_2$) gas. Further, the charge gas may be an inert gas having ionization energy that is substantially equal to or greater than that of the nitrogen gas.

By supplying a charge gas, pressure of an external chamber between the reactor and the chamber cover 400 and the chamber lower plate 490 may be maintained lower by about 0.2 Torr to about 2 Torr than process pressure within the reactor. By supplying an inert charge gas to the external chamber for a deposition process, parasitic plasma can be prevented from being generated within the external chamber. Further, by setting pressure of the external chamber to be slightly lower than pressure within the reactor, a charge gas that is supplied to the external chamber can be prevented from being injected into the reactor. Further, by using the nitrogen ($N_2$) gas as a charge gas, parasitic plasma can be effectively prevented from being generated within the external chamber. Further, even when using an inert gas having ionization energy that is substantially equal to or greater than that of the nitrogen gas as a charge gas, parasitic plasma can be effectively prevented from being generated within the external chamber.

Thereafter, after the supply of a raw material is stopped and the substrate supports 420a, 420b, and 420c move downward, a substrate in which a desired thin film is formed is taken out, and a new substrate is put, and this process is repeated.

In the present exemplary embodiment, three reactors are provided, but as described above, the number of the reactors may be 2 to 8.

In this way, in a deposition apparatus and a deposition method according to an exemplary embodiment of the present invention, by supplying an inert charge gas to an external chamber between a reactor and an outer wall, parasitic plasma can be prevented from being generated within the external chamber. Further, by setting pressure of the external chamber to be slightly lower than pressure within the reactor, a charge gas that is supplied to the external chamber can be prevented from being injected into the reactor.

Hereinafter, an Experimental Example of the present invention will be described with reference to Table 1.

In the present Experimental Example, when using argon (Ar) as a charge gas in the external chamber while supplying plasma power into the reactor, and when supplying plasma power to the internal reactor while supplying nitrogen ($N_2$) instead of argon (Ar), it was determined whether parasitic plasma is generated within the external chamber, and a result thereof is represented in Table 1. In this case, pressure within the reactor was about 2 Torr, and pressure within an external chamber to which a charge gas is supplied was about 1.8 Torr.

TABLE 1

| Plasma power (W) | Charge gas | |
| --- | --- | --- |
| | Argon (Ar) | Nitrogen(N2) |
| 100 | Parasitic plasma not generated | Parasitic plasma not generated |
| 200 | Parasitic plasma not generated | Parasitic plasma not generated |
| 300 | Parasitic plasma not generated | Parasitic plasma not generated |
| 400 | Parasitic plasma not generated | Parasitic plasma not generated |
| 500 | Parasitic plasma not generated | Parasitic plasma not generated |
| 600 | Parasitic plasma not generated | Parasitic plasma not generated |
| 700 | Parasitic plasma not generated | Parasitic plasma not generated |
| 800 | Parasitic plasma not generated | Parasitic plasma not generated |
| 900 | Parasitic plasma not generated | Parasitic plasma not generated |
| 1000 | Parasitic plasma not generated | Parasitic plasma not generated |
| 1100 | Parasitic plasma not generated | Parasitic plasma not generated |
| 1200 | Parasitic plasma not generated | Parasitic plasma not generated |
| 1300 | Parasitic plasma generated | Parasitic plasma not generated |
| 1400 | Parasitic plasma generated | Parasitic plasma not generated |
| 1500 | Parasitic plasma generated | Parasitic plasma not generated |
| 1600 | Parasitic plasma generated | Parasitic plasma not generated |
| 1700 | Parasitic plasma generated | Parasitic plasma not generated |
| 1800 | Parasitic plasma generated | Parasitic plasma not generated |
| 1900 | Parasitic plasma generated | Parasitic plasma not generated |
| 2000 | Parasitic plasma generated | Parasitic plasma not generated |

Referring to Table 1, when argon (Ar) was used as a charge gas, in a process using high-RF power plasma of 1300 W or more, it can be seen that parasitic plasma was generated in the external chamber. In contrast, when nitrogen ($N_2$) gas was used as a charge gas, it can be seen that parasitic plasma was not generated regardless of a change of internal pressure of the reactor. That is, ionization energy of argon (Ar) is 1,520.6 KJ/mol and is less than ionization energy 1,503 MJ/mol of nitrogen ($N_2$) gas, and thus, is easily ionized and plasma may be easily generated, but because nitrogen ($N_2$) gas has ionization energy that is greater than that of argon (Ar), it can be seen that nitrogen ($N_2$) gas can effectively prevent parasitic plasma from being generated compared to when argon (Ar) was used.

As in a deposition apparatus according to an exemplary embodiment of the present invention, when using nitrogen ($N_2$) gas as a charge gas in an external chamber, even if high plasma generating power is supplied to an internal reaction chamber, it can be seen that parasitic plasma can be effectively prevented from being generated within the external chamber. Further, in the present invention, although nitrogen ($N_2$) gas was applied, other inert gases having ionization energy that is greater than that of argon (Ar) gas, for example, an inert gas having ionization energy that is substantially equal to or greater than that of nitrogen ($N_2$), can be used as a charge gas for suppressing generation of parasitic plasma.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A depositing method, comprising:
   a first step of supplying a raw material gas to a reaction chamber;
   a second step of generating plasma in the reaction chamber;
   repeating the first step and the second step multiple times; and
   supplying a charge gas to an external chamber that encloses the reaction chamber through a charge gas inlet during the first step and the second step,
   wherein the charge gas is one or more inert gases that has (or have) ionization energy equal to or greater than ionization energy of nitrogen.

2. The method of claim 1, wherein pressure that is maintained by the charge gas that is supplied to the external chamber is lower than pressure within the reaction chamber.

3. The method of claim 2, wherein the charge gas comprises nitrogen.

4. The method of claim 3, wherein the reaction chamber exists in plural.

5. The method of claim 1, wherein the charge gas comprises nitrogen.

6. The method of claim 5, wherein the reaction chamber exists in plural.

7. The method of claim 1, wherein the reaction chamber exists in plural.

* * * * *